United States Patent [19]
Jimba et al.

[11] Patent Number: 5,672,385
[45] Date of Patent: Sep. 30, 1997

[54] TITANIUM NITRIDE FILM-MOCVD METHOD INCORPORATING USE OF TETRAKISDIALKYLAMINOTITANIUM AS A SOURCE GAS

[75] Inventors: Hitoshi Jimba, Fuchu; So Won Kim, Inagi; Atsushi Sekiguchi, Hachiouji, all of Japan

[73] Assignee: Anelva Corporation, Fuchu, Japan

[21] Appl. No.: 611,678

[22] Filed: Mar. 6, 1996

[30] Foreign Application Priority Data

Mar. 28, 1995 [JP] Japan ................... 7-096167

[51] Int. Cl.$^6$ ............................ C23C 16/18
[52] U.S. Cl. ............ 427/248.1; 427/99; 427/255.1; 427/255.2
[58] Field of Search ............... 427/99, 248.1, 427/255.1, 255.2

[56] References Cited

U.S. PATENT DOCUMENTS

| | | | |
|---|---|---|---|
| 5,393,565 | 2/1995 | Suzuki et al. | 427/255.2 |
| 5,399,379 | 3/1995 | Sandhu | 427/255.2 |
| 5,478,780 | 12/1995 | Koerner et al. | 437/190 |
| 5,480,684 | 1/1996 | Sandhu | 427/531 |

OTHER PUBLICATIONS

So Won KIM et al., "Low Pressure and Low Temperature MOCVD of TiN Thin Films," Proceedings of the 48th Symposium on Semiconductors and Integrated Circuits Technology, Tokyo, Japan, Jun. 1–2, 1995, cover page, pp. 36–41.

M. Eizenberg et al., "TiCN: A new chemical vapor deposited contact barrier metallization for submicron devices," *Appl. Phys. Lett.* 65, (19), 7 Nov. 1994, pp. 2416–2418.

Ivo J. Raaijmakers, "Low temperature metal–organic chemical vapor depOsition of advanced barrier layers for the microelectronics industry," *Thin Solid Films*, 247, 1994, pp. 85–93. (no month).

Robert L. Jackson et al., "MOCVD of Titanium Nitride from TDEAT and $NH_3$—Process Variables Affecting Step–coverage, Resistivity and Impurity Levels," Advanced Metalization For ULSI Applications, Oct. 4–6, 1994, cover page, pp. 3–9.

Corneille et al. J. VAc. Sci. Technol. A(13)3, May/Jun. 1995. pp. 1116–11120.

*Primary Examiner*—Shrive Beck
*Assistant Examiner*—Timothy Meeks
*Attorney, Agent, or Firm*—Burns, Doane, Swecker & Mathis, LLP

[57] ABSTRACT

The present invention provides a method of depositing a titanium nitride thin film with good coverage even in a hole with a high aspect ratio by using tetrakisdialkylaminotitanium. In this method, a raw material gas of tetrakisdialkylaminotitanium is introduced into a reactor through a raw material gas introduction system. When the raw material gas is supplied to a substrate which is previously heated by a holder temperature control mechanism, predetermined thermally chemical reaction takes place to deposit a thin film consisting of titanium nitride as a main component. The pressure in the reactor is controlled by an exhaust system so as to be maintained at a predetermined value in the range of about 0.1 to 15 Pa.

13 Claims, 3 Drawing Sheets

● : Deposition rate (nm/min)
■ : Bottom coverage (%)
▲ : Resistivity (mWcm)

TITANIUM NITRIDE FILM-MOCVD METHOD INCORPORATING USE OF TETRAKISDIALKYLAMINOTITANIUM AS A SOURCE GAS

BACKGROUND OF THE INVENTION

1. Field of the Invention

The present invention relates to deposition of a thin film consisting of titanium nitride as a main component in manufacturing an electronic device such as a semiconductor device.

2. Description of the Related Art

In manufacturing electronic devices such as a semiconductor device, a superconducting device and various sensors, thin films such as a barrier film, a contact layer film, a wiring film, an insulating film and a dielectric film were conventionally deposited by employing an evaporation method, a sputtering method, a chemical vapor deposition (CVD) method, a plasma assisted CVD method and a spin coating method. In recent years, deposition of a thin film having good coverage in a hole with a high aspect ratio or a groove has increasingly been demanded as the integration density of an electronic device, particularly, a semiconductor device, has been increased.

On the other hand, recently, the necessity to deposit a thin film consisting of titanium nitride as a main component in a semiconductor device has strongly been demanded. For example, in the technique of forming a contact portion of a semiconductor integrated circuit, a thin film serving as a barrier layer consisting of titanium nitride as a main component is deposited between tungsten (W) wiring and a silicon (Si) substrate in order to prevent inter-diffusion between tungsten and silicon and obtain stable electrical characteristics. In order to prevent diffusion of copper (Cu) wiring for a logic system integrated circuit into the substrate (Si) and into an insulating layer ($SiO_2$), a thin film as a barrier layer consisting of titanium nitride as a main component is deposited between copper and silicon or silicon oxide. In the technique of wiring between respective layers of a semiconductor integrated circuit, it is necessary to deposit an electric conductor thin film in a through hole which is provided for connecting a lower aluminum layer and an upper aluminum layer. A thin film consisting of titanium nitride as a main component (referred to as "a titanium nitride thin film" or "TiN thin film" hereinafter) is also used as the electric conductor thin film. Recently, it has increasingly been demanded to deposit a titanium nitride thin film with good coverage in a hole with a high aspect ratio, for example, a contact hole and a through hole.

A method which attracts attention as a method of depositing the titanium nitride thin film with relatively good coverage is a CVD process, i.e., a metal organic CVD (MOCVD) process, which uses an organometallic compound or organometallic complex.

For example, M. Eizenberg et al., Appl. Phys. Lett., 65(19), PP. 2416–2418, Nov. 7, 1994 discloses a MOCVD method of depositing a titanium nitride thin film.

In the MOCVD method of M. Eizenberg et al., a titanium nitride thin film is deposited by using as a raw material only tetrakisdimethylaminotitanium (TDMAT) in an atmosphere under a pressure of 0.45 Torr (60 Pa). In a 56-megabit DRAM (Dynamic Random Access Memory), it is desired to deposit, with a coverage of 90%, a titanium nitride thin film as an electric connector thin film in a hole such as a contact hole having a diameter of 0.25 μm and an aspect ratio of 4.0. However, the bottom coverage of the thin film deposited in a contact hole having a diameter of 0.6 μm and an aspect ratio of 1.5 by M. Eizenberg et al. was 85%. The film deposition method of M. Eizenberg et al. cannot achieve the requirement of a 90% coverage. Ivo J. Raaijmakers et al., Thin Solid Films, Vol. 247, PP. 85–93, 1994 discloses another MOCVD method of depositing a titanium nitride thin film.

In the MOCVD method of Ivo J. Raaijmakers et al., a titanium nitride film is deposited by using a raw material gas containing TDMAT or tetrakisdiethylaminotitanium (TDEAT) and ammonia ($NH_3$) in an atmosphere under a pressure of 10 Torr. However, the thin films deposited in contact holes having a diameter of 0.8 μm and an aspect ratio of 1.0 by Ivo J. Raaijmakers et al. using TDMAT-$NH_3$ and TDEAT-$NH_3$ had coverages of 20% and 85%, respectively. This method also cannot achieve the requirement of a 90% coverage.

As described above, the conventional method of depositing a titanium nitride thin film by using a raw material gas containing only tetrakisdimethylaminotitanium or tetrakisdiethylaminotitanium and ammonia has the fault that it is impossible to deposit a thin film in a contact hole having a diameter of 0.25 μm and an aspect ratio of 4.0 with a coverage of 90%, which is required for a barrier layer of a 256-Mb DRAM.

SUMMARY OF THE INVENTION

The present invention has been achieved for solving the above problems, and an object of the invention is to provide a method of depositing a titanium nitride thin film with good coverage even in a hole having a high aspect ratio by using tetrakisdialkylaminotitanium.

In order to achieve the object, the present invention provides a method of depositing a thin film consisting of titanium nitride as a main component, comprising the step of providing a thermal chemical reaction of vaporized tetrakisdialkylaminotitanium as a raw material gas. In this method, the thermally chemical reaction occurs in an atmosphere under pressure which is set in the range of about 0.1 to about 15 Pa which provides unexpectedly excellent coverage even in a hole having a high aspect ratio.

In order to increase the conductivity of the film deposited by the method, an additive gas is added to the raw material gas. Ammonia gas is most preferable as the additive gas. When ammonia gas is added at a rate of 15 sccm, the bottom coverage of the titanium nitride thin film reaches 100%.

Preferable examples of tetrakisdialkylaminotitanium used as a raw material include tetrakisdiethylaminotitanium, tetrakisdimethylaminotitanium, tetrakisdipropylaminotitanium, tetrakisdiisobutylaminotitanium, and tetrakis-di-tert-butylaminotitanium.

DESCRIPTION OF THE PREFERRED EMBODIMENT

A preferable embodiment of the present invention is described below.

Figure 1:
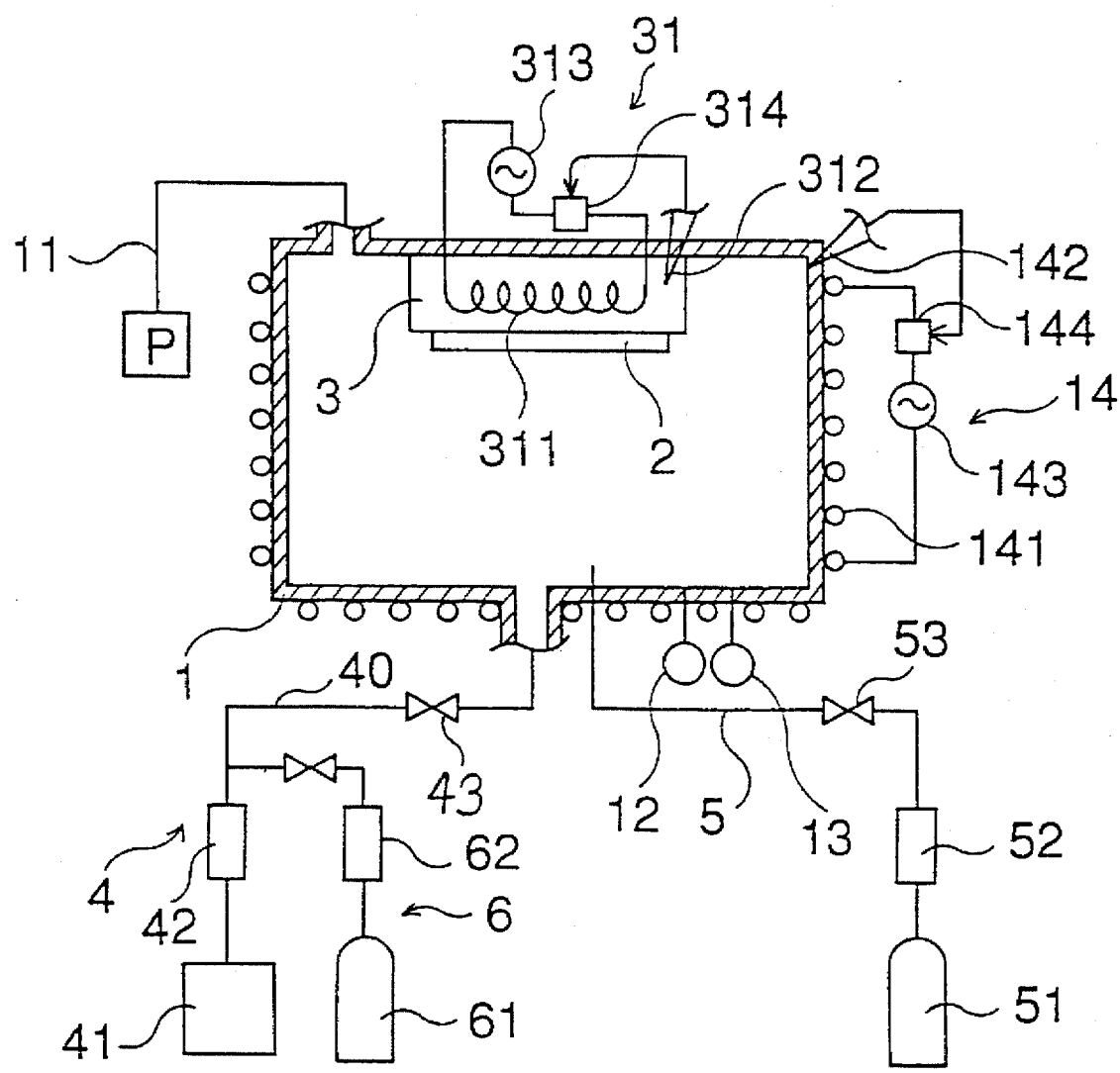
FIG. 1 is a schematic drawing of a CVD apparatus used in a preferable embodiment of the present invention.

FIG. 1 is a schematic drawing of a hot-wall type thermal CVD apparatus used in a method of depositing a titanium nitride thin film in accordance with a preferable embodiment of the present invention.

The CVD apparatus shown in FIG. 1 comprises a reactor 1 provided with an exhaust system 11 and vacuum gauges 12 and 13. The reactor 1 comprises a substrate holder 3 for fixing a substrate 2, for example, a silicon wafer, having a surface on which a titanium nitride thin film is to be formed, and a raw material gas introduction system 4 for introducing tetrakisdialkylaminotitanium as a raw material gas. The substrate holder 3 has a holder temperature control mechanism 31 provided therein for heating the substrate through the substrate holder 3. When the substrate 2 is heated, thermally chemical reaction of the raw material gas introduced into the reactor 1 takes place to deposit a titanium nitride thin film. The reactor 1 which is an airtight stainless vessel is evacuated to produce a vacuum state by the exhaust system 11. The exhaust system 11 comprises an oil-sealed rotary pump and a turbo-molecular pump. This system can evacuate the reactor 1 to a degree of $10^{-4}$ Pa.

A diaphragm vacuum gauge and an ionization vacuum gauge are used as the vacuum gauges 12 and 13, respectively, for measuring the pressure in the reactor 1. A vacuum gauge for measuring pressure within the range of about 0.1 to 133 Pa with high precision, for example, Varatron TYPE18A produced by MKS Co., Ltd. is used as the diaphragm vacuum gauge 12. A vacuum gage for measuring pressure within the range of about $10^{-2}$ to $10^{-6}$ Pa, for example, BA Gauge UGD-LS produced by ANELVA Corp. is used as the ionization vacuum gauge 12.

A reactor temperature control mechanism 14 is provided on the outer wall of the reactor 1. The reactor temperature control mechanism 14 comprises a heater 141 disposed along the outer wall of the reactor 1, a thermocouple 142 provided on the outer wall of the reactor 1, a power supply 143 for supplying electricity to increase the temperature of the heater 141, and a controller 144 for controlling the output current of the power supply 143. The controller 144 uses a control element, e.g., a thyristor unit, on the basis of the temperature of the reactor 1 which is measured by the thermocouple 142. The controller 144 performs PID control, PI control, ON-OFF control or fuzzy control. The reactor temperature control mechanism 14 heats the reactor 1 to about 70° C.

The reactor 1 is also provided with a gate valve (not shown) through which the substrate 2 is transferred into and from the reactor 1. The substrate 2 on which a titanium nitride thin film is deposited is transferred into the reactor 1 through the gate valve and held by the substrate holder 3.

The substrate holder 3 comprises a holder temperature control mechanism. The holder temperature control mechanism comprises a heater 311 embedded in the substrate holder 3, a thermocouple 312 for measuring the temperature of the substrate holder 3, a power supply 313 for supplying electricity to increase the temperature of the heater 311, and a controller 314 for controlling the output current of the power supply 313. The controller 314 uses a control element, e.g., a thyristor, on the basis of the temperature of the substrate holder 3, which is measured by the thermocouple 312. The controller 314 performs PID control, PI control, ON-OFF control or fuzzy control. The holder temperature control mechanism 31 heats the substrate holder 3 to about 350° C.

On the reactor 1 is provided a raw material gas introduction system 4, an additive gas introduction system 5 and a carrier gas introduction system 6. The raw material gas introduction system 4 comprises a raw material container 41 containing liquid tetrakisdialkylaminotitanium (referred to as "TDAAT" hereinafter) as a raw material. The raw material can be, for example, tetrakisdiethylaminotitanium (TDEAT) or tetrakisdimethylaminotitanium (TDMAT). Vaporization means (not shown) for vaporizing TDAAT, for example, a bubbler or vaporizer, and a flow rate controller 42 for controlling the flow rate of TDAAT are also part of the raw material gas introduction system 4. The raw material container 41 is made of stainless steel and has an inner wall which is subjected to an electrolytic polishing treatment.

The additive gas introduction system 5 comprises a gas tank containing an additive gas, e.g., ammonia gas, a flow rate controller 52 for controlling the flow rate of the additive gas and a valve 53. The carrier gas introduction system 6 comprises a gas tank 61 containing a predetermined carrier gas, and a flow rate controller 62 for controlling the flow rate of the carrier gas.

The gas mixture of TDEAT gas and the carrier gas is introduced into the reactor 1 through a pipe 40. The pipe 40 is provided with a temperature control mechanism (not shown) for preventing liquefaction of TDAAT gas and a valve 43.

The TiN thin film-MOCVD method in accordance with a preferable embodiment of the present invention is described by describing the operation of the above-described CVD apparatus.

The substrate 2 is transferred into the reactor 1 through the gate valve (not shown) by a conveyor robot which is not shown in the drawings. The substrate 2 is then held by the substrate holder 3. The substrate holder 3 is previously heated to about 350° C. by the holder temperature control mechanism 31. Therefore, the substrate 2 is also heated to about 350° C. The reactor 1 is evacuated to about $10^{-4}$ Pa by the exhaust system 11. During the evacuation, the pressure in the reactor 1 is measured by the diaphragm vacuum gauge 12 and the ionization gauge 13.

After evacuation, the valve 43 provided on the pipe 40 for introducing the raw material gas and the carrier gas is opened. The gas mixture of the TDAAT raw material gas and the carrier gas is introduced into the reactor 1. At the same time, the valve 53 provided on the additive gas introduction system 5 is opened to introduce the additive gas into the reactor 1.

The introduced TDAAT gas is heated by the reactor temperature control mechanism 14 provided on the reactor 1, and is then further heated on the substrate 2 by the holder temperature control mechanism 31 to cause thermally chemical reaction. As a result, a titanium nitride thin film is deposited on the surface of the substrate 2. When the film thickness reaches a predetermined value, for example, 200 to 300 Å, the valves 43 and 53 are closed to stop the supply of the raw material gas and the additive gas, respectively. The gas remaining in the reactor 1 is exhausted by the exhaust system 11. After exhaust, the inside of the reactor 1 is returned to atmospheric pressure, and the substrate is removed from the reactor 1 by the conveyor robot.

In the deposition of the titanium nitride thin film, the pressure in the reactor 1 is set in the range of about 0.1 to 15 Pa. Setting the pressure slightly deviating from this pressure range, e.g., about 0.09 Pa or 15.1 Pa, achieves substantially the same advantages. The pressure range of 0.1 to 15 Pa is controlled by adjusting the flow rates of the TDAAT gas, the carrier gas and the additive gas. Their flow rates are adjusted by the flow rate controllers 42, 62 and 52, respectively. In short, the pressure in the reactor 1 is controlled by operating the flow rate controllers 42, 52 and 62. The pressure in the reactor is set in accordance with flow rate conditions corresponding to the pressure in the range of 0.1 to 15 Pa, which has been previously obtained by preliminary test. In the preliminary test and the deposition of a titanium nitride thin film, the pressure in the reactor 1 is measured by the diaphragm vacuum gauge 12. During the deposition of a titanium nitride thin film, the pressure in the reactor 1 is always monitored by the diaphragm vacuum gauge 12 so that it can be in the above range.

Figure 2:
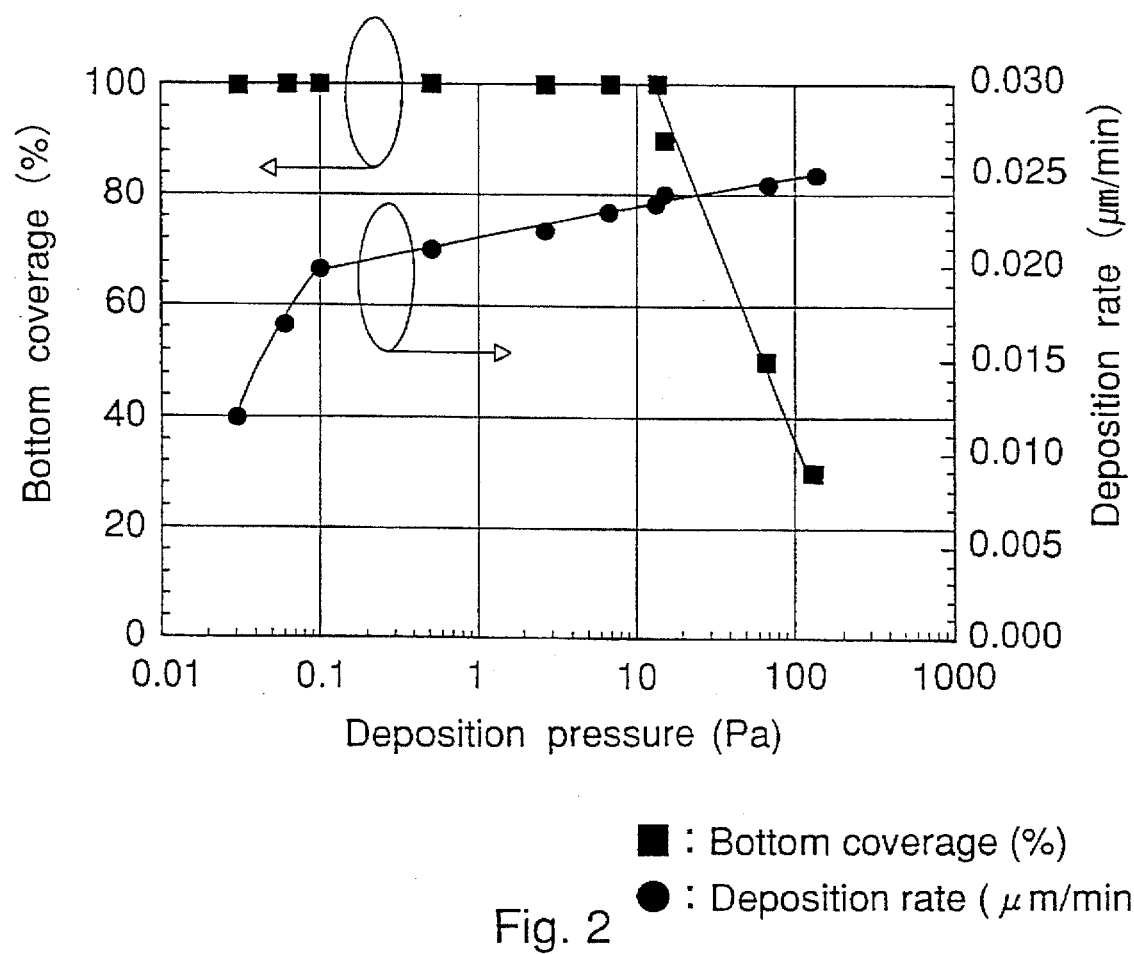
FIG. 2 is a graph showing the dependency of deposition rate and bottom coverage on the pressure during deposition of a titanium nitride thin film.

FIG. 2 shows the dependency of the deposition rate and the bottom coverage on the pressure in deposition of a titanium nitride thin film.

A titanium nitride thin film was deposited on a silicon wafer having a surface on which contact holes having a diameter of 0.25 μm and an aspect ratio of 4.0 were patterned. When depositing the thin film, the temperature of the silicon wafer was set to 300° C. The flow rate of TDEAT used as TDAAT in a liquid state can be set within the range of 0.004 to 0.20 g/min. In this case, the flow rate of TDEAT in a liquid state was set to 0.01 g/min. during the film deposition. In depositing the thin film, the flow rates of nitrogen gas used as the carrier gas and ammonia gas used as the additive gas were set to 150 sccm and 15 sccm, respectively.

In order to set the pressure in the reactor 1, the relation between a desired pressure and the pressure of the gas mixture of the nitrogen gas and the ammonia gas, and the flow rate of TDEAT gas is previously determined. The relation is established from the total pressure measured when the TDEAT gas is added under this pressure of the gas mixture.

The nitrogen gas and ammonia gas are introduced into the reactor 1 to set the pressure thereof to a value slightly lower than the desired pressure by adjusting a valve (not shown) provided in the exhaust system 11 in accordance with the predetermined relation. The TDEAT gas which is set to a flow rate of 0.12 g/min. in a liquid state is then introduced into the reactor 1 to slightly increase the pressure to reach the desired pressure. In this way, an atmosphere under desired pressure is obtained in the reactor 1.

In a graph of FIG. 2, the pressure (Pa) in the reactor 1 at the time of deposition of a thin film is shown on the abscissa, the bottom coverage (%) is shown on the left ordinate, and the deposition rate (μm/min.) is shown on the right ordinate. The bottom coverage is indicated by mark ●, and the deposition rate is indicated by mark ■.

As shown in FIG. 2, at a pressure lower than 0.1 Pa, the deposition rate is significantly decreased, thereby causing difficulties in practical use. At a pressure over 15 Pa, the bottom coverage is significantly decreased, and thus such a pressure is unsuitable for depositing a film in a hole having a high aspect ratio, such as a contact hole. The use of TDMAT as TDAAT produces the same results as described above. The use of tetrakisdipropylaminotitanium, tetrakisdiisobutylaminotitanium, and tetrakis-di-tert-butylaminotitanium as TDAAT also produced the same results. Since these compounds as TDAAT are solids at room temperature and atmospheric pressure, when these compounds are used as TDAAT for depositing the titanium nitride thin film, the compounds are dissolved in a solvent, e.g., hexane, to form liquid raw materials.

These experimental results show that when a titanium nitride thin film is deposited by using TDAAT, it is necessary for achieving a high coverage and a high deposition rate to set the pressure range of 0.1 to 15 Pa. The effectiveness of the pressure condition was confirmed even if the flow rate of the raw material gas was changed within the range of 0.004 to 0.20 g/min. in a liquid state.

A reason for the deposition of a titanium thin film with high coverage and high deposition rate under the above pressure range is thought to be as follows: At a lower pressure, the raw material gas is not sufficiently supplied to the substrate 2, thereby decreasing the deposition rate. At a pressure over 15 Pa, active intermediate species which exhibit a high possibility of sticking to the surface of the substrate are possibly produced in a space in front of the substrate. Before the active intermediate species reach the bottom of a hole, the active intermediate species stick to the surface of the substrate and the side wall of the hole. The possibility that the active intermediate species reach the bottom of the hole is thus decreased, thereby deteriorating the coverage. At a pressure lower than 15 Pa, the generation of such active intermediate species having a high sticking possibility is suppressed, and a large amount of active intermediate species having a low sticking possibility is produced. Since such active intermediate species have a high possibility that they reach the bottom of the hole, the coverage of the hole may be thought to be consequently improved.

Figure 3:
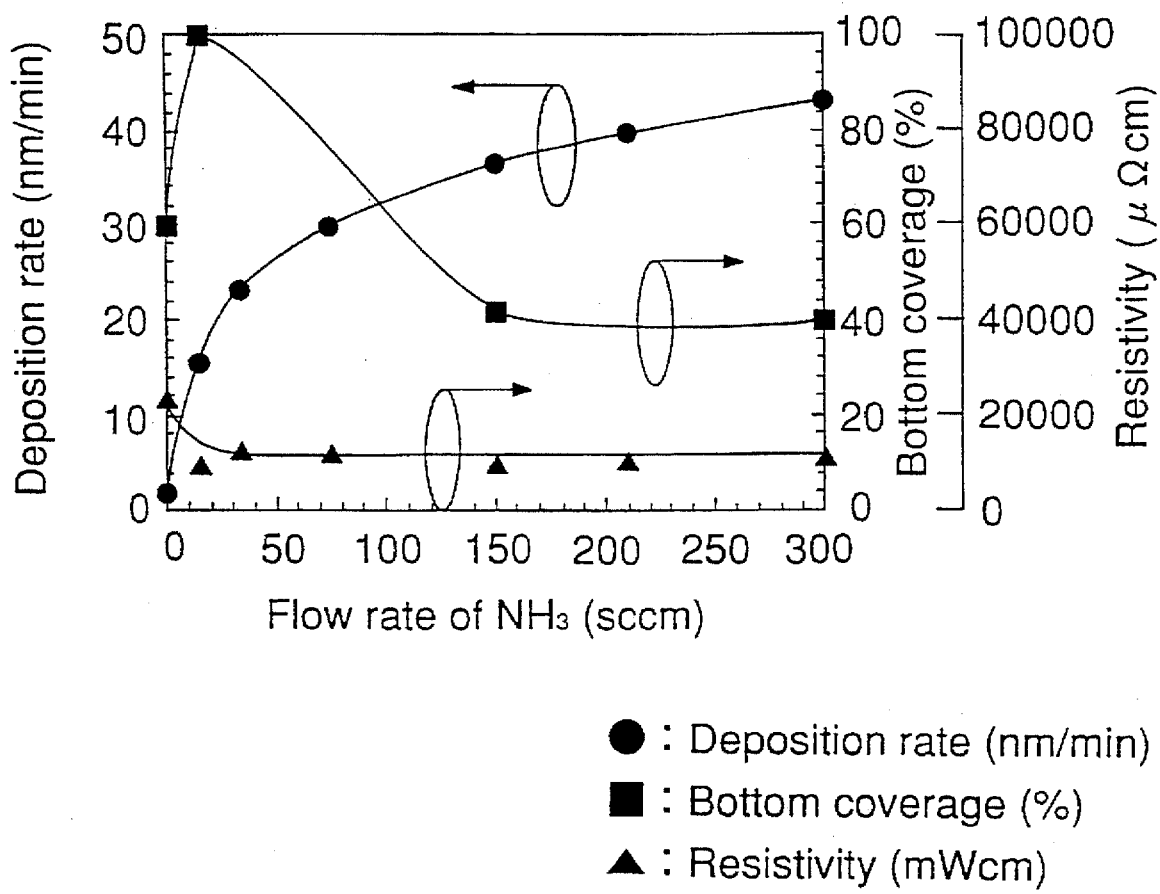
FIG. 3 is a graph showing the dependency of deposition rate, bottom coverage and resistivity on the flow rate of ammonia gas used as an additive gas.

FIG. 3 shows the dependency of the deposition rate, the bottom coverage and resistivity on the flow rate of ammonia gas as the additive gas. In a graph of FIG. 3, the flow rate (sccm) of ammonia gas is shown on the abscissa, the deposition rate (nm/min) is shown on the left ordinate, and the bottom coverage (%) and resistivity (μΩcm) are shown on the right inner and outer ordinates, respectively. The deposition rate is indicated by mark ●, the bottom coverage is indicated by mark ■, and resistivity is indicated by mark ▲.

A titanium thin film was deposited under a pressure of 6.7 Pa, on a silicon wafer at a temperature of 300° C. having a surface on which a contact hole with a diameter of 0.25 μm and an aspect ratio of 4.0 was patterned. During the deposition, the flow rate of TDEAT used as TDAAT was set to 0.01 g/min. in a liquid state, and the flow rate of nitrogen gas used as the carrier was set to 150 sccm.

When the flow rate of ammonia gas is 15 sccm, the bottom coverage reaches 100%. Without adding ammonia gas, the resistivity is about 24,000 μΩcm. When ammonia gas is added at a flow rate of 15 sccm, the resistivity is decreased to about 10,000 μΩcm. Even if ammonia gas is added at a rate of 15 sccm or more, the resistivity is kept at about 10,000 μΩcm. Without adding ammonia gas, the deposition rate is about 2 nm/min. when ammonia gas is added at a flow rate of 15 sccm, the deposition rate is rapidly increased to about 16 nm/min. When the flow rate of ammonia gas is further increased, the deposition rate is slowly increased.

In the above embodiment, the ammonia gas used as the additive gas is adapted for improving conductivity of the titanium nitride thin film. A bottom coverage of 100% is attained if the flow rate of ammonia gas is 15 sccm within the pressure range of 0.1 to 15 Pa in the TiN film deposition in adding ammonia gas.

As described above, the method of depositing a titanium nitride thin film of the present invention deposits a thin film in a hole having a high aspect ratio, with a high deposition rate and a high coverage. If ammonia gas is added, a coverage of 100% can be attained.

The above exemplary embodiments are illustrative and not restrictive of the present invention. The scope of the invention is to be determined by reference to the appended claims.

What is claimed is:

1. A method of depositing a thin film comprising titanium nitride as a main component on a surface of a substrate, said method comprising the steps of:

providing a substrate on which contact holes having a diameter of 0.25 μm and aspect ratio of 4.0 are patterned;

providing a thermal chemical reaction of tetrakisdialkylaminotitanium gas used as a raw material gas in an atmosphere under a pressure in a range of about 0.1 to about 15 Pa thereby forming a titanium nitride thin film covering about 100% of the bottoms of said contact holes.

2. A method of depositing a titanium nitride thin film according to claim 1, wherein an additive gas is added to the raw material gas.

3. A method of depositing a titanium nitride thin film according to claim 2, wherein the additive gas is ammonia gas.

4. A method of depositing a titanium nitride thin film according to claim 3, wherein the ammonia gas is added at a flow rate of 15 sccm to the raw material gas.

5. A method of depositing a titanium nitride thin film according to claim 1, wherein tetrakisdialkylaminotitanium as the raw material gas is selected from the group consisting of tetrakisdiethylaminotitanium, tetrakisdimethylaminotitanium, tetrakisdipropylaminotitanium, tetrakisdiisobutylaminotitanium and tetrakis-di-tert-butylaminotitanium.

6. A method of depositing a titanium nitride thin film, comprising the steps of:

heating a reactor to a first temperature above room temperature;

placing a substrate on which contact holes having a diameter of 0.25 μm and aspect ratio of 4.0 are patterned in said reactor;

heating said substrate to a second temperature above ambient temperature;

introducing a tetrakisdialkylaminotitanium (TDAAT) gas into said reactor, said reactor having a deposition pressure in a range of about 0.1 to about 15 Pa thereby forming a titanium nitride thin film covering about 100% of the bottoms of said contact holes.

7. A method of depositing a titanium nitride thin film according to claim 6, wherein said TDAAT introduction step further comprises the step of:

introducing an additive gas with said TDAAT gas.

8. A method of depositing a titanium nitride thin film according to claim 7, wherein the additive gas is ammonia gas.

9. A method of depositing a titanium nitride thin film according to claim 8, wherein the ammonia gas is added at a flow rate of 15 sccm to the tetrakisdialkylaminotitanium gas.

10. A method of depositing a titanium nitride thin film according to claim 6, wherein said TDAAT introduction step further comprises the step of:

introducing a carrier gas with said TDAAT gas.

11. A method of depositing a titanium nitride thin film according to claim 6, wherein said TDAAT introduction step further comprises the step of:

first evacuating said reactor to about $10^{-4}$ Pa;

simultaneously introducing TDAAT gas, a carrier gas, and an additive gas into said reactor;

heating said TDAAT gas, carrier gas and additive gas in said reactor, and further heating said TDAAT gas, carrier gas and additive gas on said substrate.

12. A method of depositing a titanium nitride thin film according to claim 11, wherein said first temperature is about 70° C. and said second temperature is about 350° C.

13. A method of depositing a titanium nitride thin film according to claim 6, wherein said tetrakisdialkylaminotitanium gas is selected from the group consisting of tetrakisdiethylaminotitanium, tetrakisdimethylaminotitanium, tetrakisdipropylaminotitanium, tetrakisdiisobutylaminotitanium and tetrakis-di-tert-butylaminotitanium.

* * * * *